United States Patent
Hochstenbach et al.

(10) Patent No.: US 7,196,416 B2
(45) Date of Patent: Mar. 27, 2007

(54) ELECTRONIC DEVICE AND METHOD OF MANUFACTURING SAME

(75) Inventors: Hendrik Pieter Hochstenbach, Nijmegen (NL); Andrea Henricus Maria Van Eck, Nijmegen (NL); Rintje Van Der Meulen, Nijmegen (NL)

(73) Assignee: NXP B.V., Eindhoven (NL)

( * ) Notice: Subject to any disclaimer, the term of this patent is extended or adjusted under 35 U.S.C. 154(b) by 149 days.

(21) Appl. No.: 10/539,367

(22) PCT Filed: Dec. 10, 2003

(86) PCT No.: PCT/IB03/05976

§ 371 (c)(1),
(2), (4) Date: Jun. 15, 2005

(87) PCT Pub. No.: WO2004/057668

PCT Pub. Date: Jul. 8, 2004

(65) Prior Publication Data

US 2006/0099742 A1 May 11, 2006

(30) Foreign Application Priority Data

Dec. 20, 2002 (EP) ................................. 02080664

(51) Int. Cl.
*H01L 23/34* (2006.01)
*H01L 21/44* (2006.01)

(52) U.S. Cl. ................ 257/712; 257/675; 257/778; 257/E23.08; 438/122; 438/127

(58) Field of Classification Search ............... 257/675, 257/712, 713, 717, 720, 777, 778, 787, 796; 438/111, 112, 122–127
See application file for complete search history.

(56) References Cited

U.S. PATENT DOCUMENTS

| | | | |
|---|---|---|---|
| 6,225,699 B1 | 5/2001 | Frence et al. | |
| 6,602,737 B2 * | 8/2003 | Wu | 438/122 |
| 6,869,827 B2 * | 3/2005 | Vaiyapuri | 438/109 |
| 6,967,395 B1 * | 11/2005 | Glenn et al. | 257/676 |
| 6,987,032 B1 * | 1/2006 | Fan et al. | 438/122 |
| 7,008,823 B2 * | 3/2006 | Akram | 438/109 |
| 7,064,009 B1 * | 6/2006 | McCann et al. | 438/112 |
| 7,112,878 B2 * | 9/2006 | Akram | 257/686 |
| 2002/0167079 A1 * | 11/2002 | Pu et al. | 257/685 |
| 2005/0153483 A1 | 7/2005 | Groenhuis et al. | |

* cited by examiner

*Primary Examiner*—Kevin M. Picardat
(74) *Attorney, Agent, or Firm*—Peter Zawilski

(57) ABSTRACT

The electronic device (100) is a chip-on-chip construction on a lead frame (10) comprising a heat sink (13) in an encapsulation (80). The first chip (20) and the second chip (30) are mutually connected by first conductive interconnections (24) and the first chip (20) is connected to the lead frame (10) by second conductive interconnections (27) which preferably have a lower reflow temperature than the first conductive interconnections (24). By heating the device (100) the adhesive layer (25) will first shrink, causing a stress, which will be relaxed by reflowing the second conductive interconnections (27).

11 Claims, 2 Drawing Sheets

ELECTRONIC DEVICE AND METHOD OF MANUFACTURING SAME

The invention relates to an electronic device comprising:

a first chip having an active side and a back side, on which active side the first chip has first and second conductive interconnections;

a second chip having an active side and a back side, on which active side the second chip has first conductive interconnections, the active sides of the first and second chips facing each other, the first conductive interconnections of the chips being mutually connected in electroconductive manner by first metal interconnections;

a substrate having a first side facing the active side of the first chip, the substrate comprising conductive interconnections which are electroconductively connected to the second conductive interconnections of the first chip by means of a second metal interconnection.

The invention also relates to a method of manufacturing such an electronic device in which a unit of the first chip and the second chip is mounted on the first side of the substrate while forming electrical contract between the conductive interconnections on the substrate and the second conductive interconnections on the first chip by means of the second metal interconnection.

Such a device and such a method are known from U.S. Pat. No. 6,225,699B1. The first and second chips are a processor chip and a memory chip in particular. It is observed that within the context of this application a chip comprises a circuit of components which are mounted on a substrate. In the known device the substrate is an apparently arbitrary substrate having a flat surface, such as a carrier, a substrate or a third chip. The metal interconnections in the known device are metal balls or solder balls, solder columns, electroplated copper columns, micro-velcro interconnections, polymer metal interconnections or what is called C4 (controlled collapse chip connections). The second metal interconnection is here particularly a part having a high melting point—also called reflow temperature—and a part having a lower reflow temperature than that of the first metal interconnection. In this way it is achieved that the height of the second metal interconnection is at least as large as the height of the second chip and the first metal interconnection together.

The known device, however, has various disadvantages. When the substrate is a carrier, such as a printed circuit board, it is disadvantageous for the second chip to be hardly protected or not protected at all. In addition, assembling the device on the carrier, which is to be effected by a consumer, is rather sensitive to deviations in the temperature used. At too high a temperature the first metal interconnections will give way, whereas at too low a temperature no proper contact between the conductive interconnections on the carrier and those on the first chip is realized.

When this substrate is a third chip or a substrate having a flat surface—i.e. a substrate of a ceramic material as applied as an interposer substrate—the device has other disadvantages. For example, the height of the total device is rather great, whereas interposer substrates turn out to be too expensive in many applications.

It is therefore a first object of the invention to provide a device of the type defined in the opening paragraph, which can be mounted on a carrier without specific measures being taken by a user and, additionally, satisfies the requirements customary for semiconductor devices.

This first object is achieved in that:

the substrate comprises a heat sink which is connected to the back of the second chip by conductive adhesive, and comprises contact surfaces that can be contacted on the second side of the substrate; and an encapsulation of passivating material is present which envelops the first and second chips at any rate substantially and which the substrate is adhered to.

The device according to the invention appears as a substrate with contact surfaces, on which an encapsulation is present with a number of elements inside. The encapsulation is then not only a protective layer against dirt, moist and similar influences. The encapsulation is also and especially the material that provides mechanical stability of the device. If during a further soldering or heat treatment the temperature rises beyond the reflow temperature or one or more of the metal interconnections or parts thereof, the device does not disintegrate thanks to the encapsulation. The encapsulation then provides proper adhesion between the substrate and the rest of the device. This is preferably realized by openings in the substrate so that the substrate is embedded and secured in the encapsulation.

The mechanical function of the encapsulation additionally makes it possible to largely omit the substrate, i.e. to limit the substrate to one or more conductive layers for the necessary interconnects and external contacting. This reduces the size of the device, more particularly the thickness. Even with a substrate the device, however, is more compact already than the known device with a ceramic substrate or a third chip. In the device there are contact surfaces on the second side of the substrate. This means that a perpendicular projection of the contact surfaces on the active side of the first chip is largely located within the first chip. In known technology, with a further chip or with an interposer substrate, there are no interconnections through the substrate to the second side. The contact surfaces lie on the first side, outside the first chip.

The presence of an encapsulation does complicate the heat dissipation of the first chip, however. In order to solve this attendant problem the device comprises a heat sink which is connected to the back of the first chip by a conductive adhesive. For this purpose this back side preferably comprises an electrically conductive layer. It is observed that the heat sink may also or even primarily be used as ground, if so desired.

In an advantageous embodiment the second metal interconnection has at least partly a lower reflow temperature than the first metal interconnection. More particularly a metal ball is made use of in this respect. Surprisingly it has been found that such a metal ball does not flow despite such a low reflow temperature. Experiments in which the not-yet-encapsulated device has been passed through the reflow oven ten times have shown that despite the low temperature the second metal interconnection did not break down. Favorable materials are, inter alia, solder of tin, silver and copper, also known as SAC solder, having at least 95% Sn, 3–5% Ag and 0.1% Cu, and eutectic PbSn. It should be observed that the metal interconnection may also be formed from different parts, for example, from a copper column and a small solder ball on top.

In addition it has been found that by applying such a low-melting second metal interconnection, inaccuracies in the thickness of the second chip, the first metal interconnection, the adhesive layer and particularly components can be eliminated in the substrate. Thanks to the reflow the second metal interconnection the stress built up due to the deviations in the thicknesses and heights of said component parts and layers is relaxed. The result of this is that the contact surface of the heat sink and the contact surfaces of the conductive interconnections in the device have a coplanar position. Furthermore, such a relaxation effect may also be achieved in a different manner, for example, by applying an underfill between the first and second chips and using an ordinary high-melting solder for this purpose. This different manner, however, causes an additional step to be made, whereas a higher temperature is necessary during the reflow.

Furthermore, it has appeared to be advantageous to use gold balls for example, such as Au/Au, Au/NiAu or Au/Al for the first metal interconnection. Such a metal interconnection may be fixed by means of thermocompression, which offers advantages in practice.

In a further, advantageous embodiment the substrate is a lead frame having openings in which the passivating material of the encapsulation is present. Embedding of the substrate in the encapsulation occurs through the openings in the substrate. The lead frame is furthermore advantageous in that it may be very thin. In essence it is a single conductive layer or a stack of several conductive layers. A highly favorable lead frame is known as HVQFN (High Voltage Quad Flat Non-leaded). Further advantageous lead frames in essence comprise one or several layers which are deposited on a sacrifice layer. The sacrifice layer is removed after the encapsulation has been applied. An example of this is described in non-prepublished application EP 02079544.9 (PHNL021100).

In a still further, advantageous embodiment the adhesive has a layer thickness of less than 50 µm, more particularly between 10 and 25 µm. It has appeared that with a decreasing layer thickness less spreading occurs in the distance between the substrate and the back of the second chip. It is important that this spreading be limited, because there are already a number of other spreading factors. However, when the adhesive layer becomes too thin, there is a chance of insufficient bonding and the force necessary for application increases disproportionately. Too high a force creates an increased risk of breakdown of metal balls.

It is advantageous for the second chip to have a smaller surface than the first chip in a plane parallel with the active side. Albeit the second chip may also be shifted relative to the first one, it is advantageous for the mechanical stability when a second chip covers only part of the active side of the first chip.

Such a chip-on-chip construction is attractive, for example, for the combination of a microprocessor and a memory chip, for a functional chip and an identification chip. However, it is particularly advantageous when the first chip comprises an integrated circuit of in essence passive components, whereas the second chip comprises an integrated circuit of in essence active components. In this respect it is observed that the first chip nevertheless can comprise a number of active components, whereas the second chip can also comprise a number of active components. The first chip is then manufactured on a semiconductor substrate, with a conductive interconnection to the back side. The semiconductor substrate can be partly removed after manufacturing, in particular by means of etching and/or polishing, as is known to the expert. The second chip may be manufactured on a semiconductor substrate, for example, of silicon, but also on an electrically insulating substrate such as glass, $Al_2O_3$ or a ceramic material. Passive elements which may be present comprise coils, resistors and capacitors but also resonators, micro electromechanical system (MEMS) elements, antennas, microstrips and sensors.

The combination of a first, passive chip and a second, active chip is particularly advantageous since the size of passive components is usually larger than the size of active components, whereas at the same time fewer requirements are made on the resolution of the passive components. It is also advantageous for the first and second chips to have substrates with a different resistance. In particular for high-frequency applications it is advantageous for the first, passive chip and the second, active chip to be close together. For that matter, the high-frequency behavior provides that bond wires and interconnects are undesiredly active as coils. This is considerably limited in this embodiment.

In a particular embodiment the first chip is a substrate of doped semiconductor material and contains pores which extend in a direction in essence perpendicular to the plane running parallel to the active side and in which capacitors are defined. Such capacitors have a large capacitance and are therefore highly suitable as decoupling capacitors. An advantage of the use of such capacitors is that the required surface area for the capacitors remains small. As a result, for example the design condition can easily be met which says that the first conductive interconnections in essence fall within the heat sink when they are projected on the substrate.

In another embodiment a third chip is present having an active side and a back side. The active side of it comprises conductive interconnections. Just like the second chip, the active side of the third chip faces the active side of the first chip, the conductive interconnections of the third chip being mutually electroconductively connected with further conductive interconnections of the first chip by metal interconnections. The substrate then has a second heat sink which is connected by means of conductive adhesive with the back of the third chip. In this embodiment the first chip is the carrier for the second and third chips. The heat dissipation of the two chips is then ensured by independent heat sinks. If so desired for the application, the heat sinks may then be connected with different voltages.

For the presence of a third chip in the device, there are various applications. A first application is that both the second and third chips are amplifiers, each for a certain frequency band. A second application is that the second chip is a transceiver chip, whereas the third chip is a voltage-controlled oscillator. A third application is that the first chip comprises sensors, whereas the second chip drives these sensors and the third chip provides the processing of the data measured by the chip. In this respect it is advantageous, but not necessary for the first chip to comprise an integrated circuit of passive components.

It is a second object of the invention to provide a method with which the device according to the invention can be manufactured with a reliable result. This object is achieved in that the method comprises the steps of:

providing an ensemble of a first chip and a second chip, each with an active side and a back side, which active sides, comprising first conductive interconnections, are facing each other and the first conductive interconnections are mutually electroconductively connected by a first metal interconnection, the active side of the first chip comprising second conductive interconnections;

providing a substrate having a first and an opposite second side, the substrate comprising a heat sink, conductive interconnections and contact surfaces for external contacting, applying the ensemble of the first and second chips on the first side of the substrate, while the conductive interconnections having a second metal interconnection are electroconductively connected with the second conductive interconnections of the first chip and the heat sink is connected to the back of the second chip by means of conductive adhesive;

curing of the adhesive;

re-melting of at least part of the second metal interconnection under relaxation of stress caused by the shrinking of the adhesive layer during curing, and applying an encapsulation of passivating material around the first and second chips and around the metal interconnections, which material is bonded to the substrate.

When the ensemble is mounted, the second chip is pressed into the adhesive layer with such a force that a bond arises. When the adhesive is cured, this bond remains intact and the adhesive shrinks. The result is that the heat sink rises along with the adhesive. This causes a stress which is relaxed by re-melting at least part of the second metal interconnections. During this remelting also the rest of the substrate is raised. The balanced or even largely stress-free situation thus obtained is then maintained by applying the encapsulation of passivating material which cures or is cured in customary fashion, for example, by a heat treatment.

In an advantageous embodiment the conductive interconnections in the substrate are located on an elastic layer, so that when the ensemble is deposited on the substrate, the conductive interconnections can bend to a certain extent and reversibly. More particularly the elastic layer is a layer of air and the substrate is a dual or multi-layer lead frame with the conductive interconnections being supported only on one end. Thanks to the bending there is an additional stress on the substrate which adds to the shift in the direction of the first chip. Besides, a dual-layer lead frame can in this way provide that all contact surfaces, that is to say, those of the heat sink and of the conductive interconnections are ordered in a co-planar fashion.

In a further embodiment the second metal interconnection comprises a solder having a reflow temperature that is lower than the reflow temperature of the first metal interconnection. This is a simple way of preventing the first metal interconnection to break down during the relaxation step as a result of reflow. Moreover, it is advantageous for the second metal interconnection to comprise solder that can melt completely. For this provides that the second metal interconnection can shrink considerably. The purpose is then a height equal to that of the total adhesive layer, second chip and first metal interconnection. If the distance to be shrunk is about 10 micrometers, this may be realized with a 50-micrometer solder ball, but not with a 10-micrometer solder ball.

There are various techniques for applying the solder. For example, it is possible to place a solder ball on the substrate while the second conductive interconnection is covered by a layer of Au. It is alternatively possible to attach the solder ball to the second conductive interconnection of the first chip while an acid flux treatment is given during the application, or a flux layer is already present on the substrate. However, it is to be preferred to attach a solder ball to the second conductive interconnection while a solder dot having solder particles and acid in a 50—50 ratio is deposited on the substrate.

In a still further embodiment the adhesive is applied in a layer thickness of less than 50 μm. When the ensemble of the chips is mounted on the substrate, the second chip is pressed into the adhesive layer. This is done with a certain force. Now if the adhesive layer is thick, a slight deviation of the intended force will already result in a considerable deviation in the eventually obtained thickness of the adhesive layer. If the thickness of the adhesive layer diminishes, the deviation in the thickness diminishes even further in case of a deviation of the force.

These and other aspects of the invention are apparent from and will be elucidated with reference to the embodiments described hereinafter.

In the drawings.

The Figures are not drawn to scale and several parts have been shown enlarged for clarity. Like reference numerals in different Figures refer to like or comparable parts. The embodiments are merely intended as examples and must not be understood to be a restriction of the protective scope.

Figure 1A:
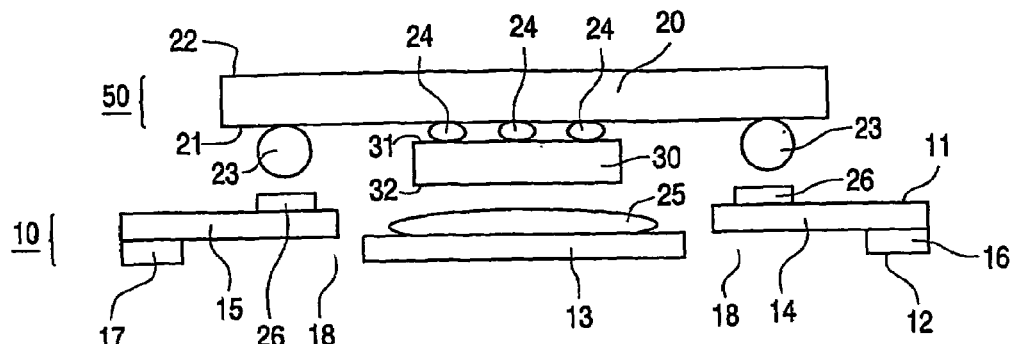
FIGS. 1A–1D show cross-sectional views of different stages in the method.

FIG. 1A shows a first step in the method in which a substrate 10 and an ensemble 50 of a first chip 20 and a second chip 30 are provided. The first chip 20 and the second chip 30 each have an active side 21, 31 and a back side 22, 32. On the active side the elements are defined i.e. an integrated circuit of passive components in the first chip 20 and an integrated circuit of active elements in the second chip 30. The second chip 30 in this example comprises a silicon substrate but may also contain a substrate of, for example, a III–V material. The first chip 20 and the second chip 30 have on their active sides 21, 31 first conductive interconnections which are not shown for clarity. The first conductive interconnections are mutually connected to first metal interconnections 24 which in this case comprise metal balls Au. The first metal interconnections 24 have come from applying Au on both the first chip 20 and the second chip 30, and then giving them a thermal compression treatment. The first metal interconnections 24 may be embedded in the underfill layer, which layer is known per se. The first chip 20 further comprises second conductive interconnections (not shown either) which have solder balls 23. It should be observed that both the first and the second conductive interconnections form a Ball Grid Array in which the pitch of the first conductive interconnections and the height of first metal interconnections 24 are smaller than the pitch of the second conductive interconnections and the height of the solder balls 23. The conductive interconnections are shaped in a layer of Cu or Al and provided, as required, with an adhesive layer known per se. The first and second conductive interconnections on the first chip 20 are mutually electrically connected either via the elements defined in the first chip or not.

The substrate 10 in this case is a lead frame and comprises a first side 11 and an opposite side 12. The substrate comprises a first and a second electrically conductive layer of Cu. The lead frame 10 is formed by skillfully etching it with a semi-etching technique, first from the first side 11 and then from the second side 12 or the other way around. This results in a heat sink 13, conductive interconnections 14, 15 and contact surfaces 16, 17, while the heat sink is also the contact surface. The heat sink 13 is customarily connected to the rest of the lead frame 10 by means of four wires. There is an open space 18 under the conductive interconnections 13, 14. On the first side 1 of the lead frame 10 a conductive adhesive 25 is applied i.e. a silver containing glass epoxy adhesive. On the first side 1 are further deposited solder dots 26, for example, by printing with a stencil.

In this way a construction has been provided that is to be attached. The second chip 30 together with the first metal interconnection 24 then has a thickness of 150±15 µm. The layers of the lead frame 10 have a thickness of 70±20µ while in the location of the heat sink 13 relative to the conductive interconnections 14, 15 there is a play of about 20 µm. The maximum spreading is thus about 55 µm. This spreading can be eliminated by remelting the solder balls 23 and the solder dots 26, and slightly in the adhesive layer 25 which, however, is chosen to be thin, for example of a thickness of about 20 µm.

Figure 1B:
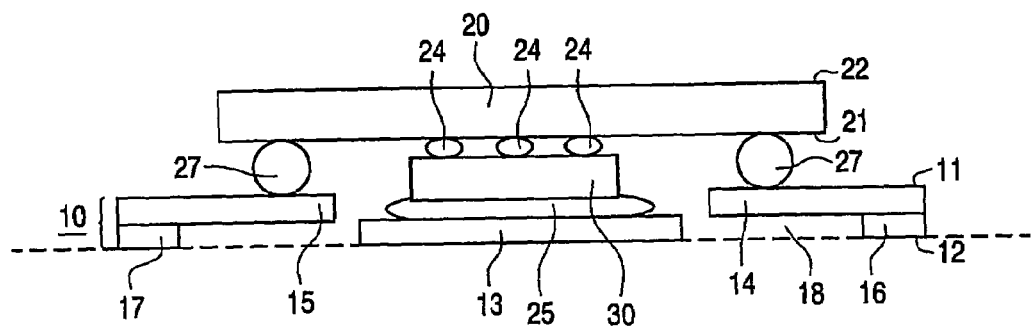

FIG. 1B shows the situation after the ensemble 50 of the first chip 20 and the second chip 30 has been attached to the first side 11 of the substrate. The back 32 of the second chip 30 is then pressed into the adhesive layer 25 while the solder dots and the solder balls are mutually connected into a metal interconnection 27. As will be understood by those skilled in the art, the metal interconnection 27 is not solid until after a heat treatment. The solder is here a low-melting SAC solder which contains over 96% Sn, 3% Ag and about 0.5% Cu. The fact that the conductive interconnections 14, 15 are slightly and reversibly bent during the attaching of the ensemble 50 is not shown. This is possible because there is an elastic layer underneath the conductive interconnections 14, 15, here a layer of air. The bending provides an upward pressure on the conductive interconnections 14, 15.

Figure 1C:
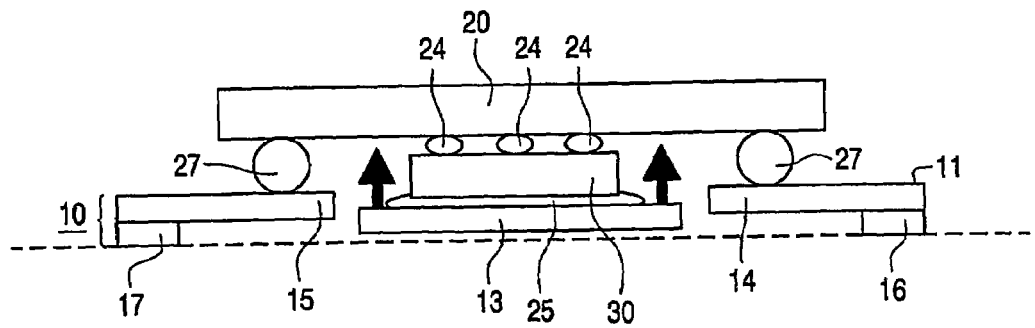

FIG. 1C shows the situation after the curing of the conductive adhesive. This takes place as a result of a heat treatment of 100–150° C. The heat sink 13 of the lead frame is then pulled up when the adhesive layer 25 shrinks. The result is a downward pressure.

Figure 1D:
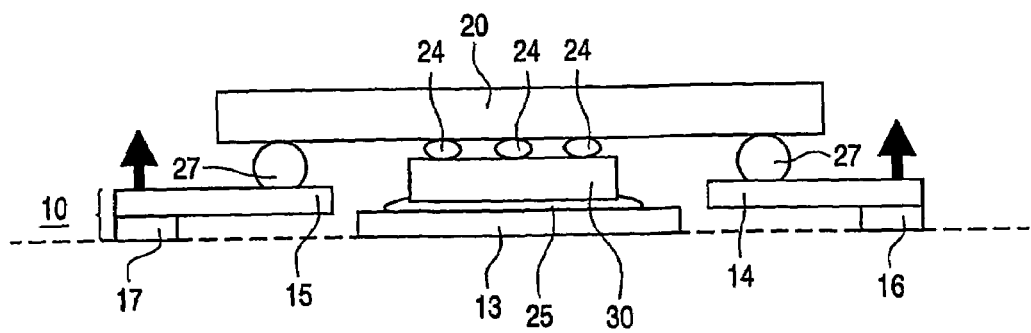

FIG. 1D shows the situation after the metal interconnections 27 are taken to beyond their reflow temperature and have been able to distort. Without the connection with the substrate 10 or with the first chip 20 being broken, the metal interconnections 27 are flattened. The result is that the stress in the conductive interconnections 14, 15 and the heat sink 13 is relaxed.

Figure 2:
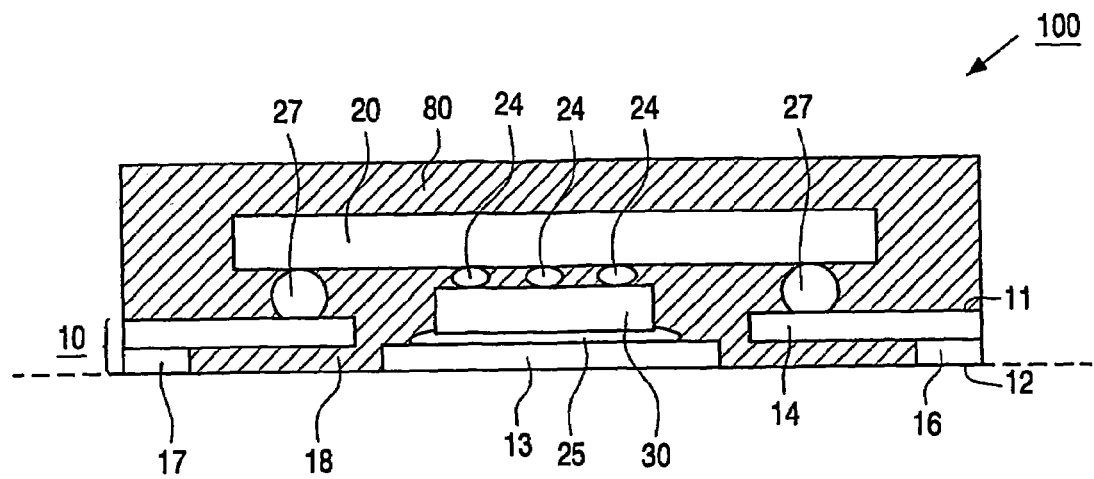
FIG. 2 shows a cross-section of the device obtained.

FIG. 2 shows the final device 100 once the encapsulation 80 has been applied. The encapsulation comprises a passivating material known per se such as a glass-filled epoxy, a polyimide or another resin that has been chosen for the desired coefficient of expansion by the expert. The substrate 10 is embedded in the encapsulation 80 here while also the openings 18 are filled and the contact surfaces on the second side 12 can be reached for external contacting. Solder balls, also of the lead-free type, may be applied to this after which the device as a whole is ready to be placed on a carrier such as a printed circuit board. From the outside the device 100 then does not differ from any other semiconductor device.

Figure 3:
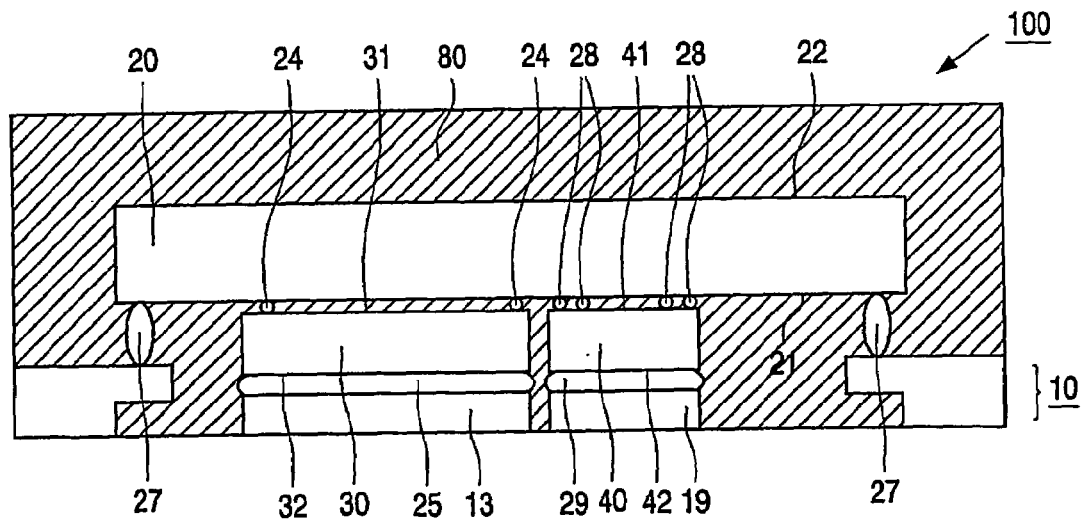
FIG. 3 shows a cross-section of a second embodiment of the device.

FIG. 3 shows in a cross-section a second embodiment of the device 100. In this embodiment a third chip 40 is present in addition to a second chip 30. Both chips 30, 40 face the active side 21 of the first chip 20 with their active sides 31, 41. First and third metal interconnections 24, 28 then provide the electrical contact. Via adhesive layers 25, 29 the chips 30, 40 are connected with their back sides 32, 42 to a first heat sink 13 and a second heat sink 19, respectively. The heat sinks 13, 19 are not connected electroconductively mutually, and may be driven at different voltages, for example +5 volts and −5 volts, as desired. The second and third chips 30, 40 are in this case amplifiers for various frequency bands. The first chip 20 is here the so-called passive chip and comprises the substrate of high-ohmic silicon in which vertical capacitors are defined. Furthermore, the first side 21 has defined on it resistors, planar capacitors having a smaller capacitance than the vertical capacitors, coils and conductive interconnections.

The invention claimed is:

1. Electronic device comprising:
    a first chip having an active side and a back side, on which active side the first chip has first and second conductive interconnections;
    a second chip having an active side and a back side, on which active side the second chip has first conductive interconnections, the active sides of the first and second chips facing each other, the first conductive interconnections of the chips being mutually connected in electroconductive manner by first metal interconnections;
    a substrate having a first side and an opposite second side, which first side faces the active side of the first chip, which substrate comprises a heat sink, conductive interconnections and contact surfaces for external contacting, which heat sink is connected by conductive adhesive with the back of the second chip and which conductive interconnections are electroconductively connected by a second metal interconnection to the second conductive interconnections of the first chip, and which contact surfaces can be contacted on the second side of the substrate; and
    an encapsulation of passivating material which envelops the first and second chips and the metal interconnections at any rate substantially and to which the substrate is attached.

2. An electronic device as claimed in claim 1, characterized in that the second metal interconnection has at least partly a lower reflow temperature than the first metal interconnection.

3. An electronic device as claimed in claim 1, characterized in that the substrate accommodates a lead frame which has openings in which the passivating material of the encapsulation is present.

4. An electronic device as claimed in claim 1, characterized in that the second chip in a plane parallel with the active side has a smaller surface area than the first chip.

5. An electronic device as claimed in claim 4, characterized in that the first chip comprises an integrated circuit of essentially passive components while the second chip comprises an integrated circuit of substantially active components.

6. An electronic device as claimed in claim 5, characterized in that the first chip comprises a substrate of doted semiconductor material with pores, which pores extend in a direction in essence perpendicular to the plane parallel with the active side and in which capacitors are defined.

7. An electronic device as claimed in claim 1, characterized in that a third chip having an active side and a back side is present, the active side comprising the third chip of conductive interconnections, the active side of the third chip facing the active side of the first chip, the conductive interconnections of the third chip being mutually electroconductively connected to further conductive interconnections of the first chip by metal wires, the substrate comprising a second heat sink which is connected to the back of the third chip by conductive adhesive.

8. A method of producing an electronic device, comprising the steps of:
    providing an ensemble of a first chip and a second chip, each with an active side and a back side, which active sides, comprising first conductive interconnections, are facing each other and the first conductive interconnections are mutually electroconductively connected by a first metal interconnection, the active side of the first chip comprising second conductive interconnections;

providing a substrate having a first and an opposite second side, the substrate comprising a heat sink, conductive interconnections and contact surfaces for external contacting, applying the ensemble of the first and second chips on the first side of the substrate, while the conductive interconnections having a second metal interconnection are electroconductively connected with the second conductive interconnections of the first chip and the heat sink is connected to the back of the second chip by means of conductive adhesive;

curing of the adhesive;

the re-melting of at least part of the second metal interconnection under relaxation of stress caused by the shrinking of the adhesive layer during curing, and applying an encapsulation of passivating material around the first and second chips and around the metal interconnections, which material is bonded to the substrate.

9. A method as claimed in claim 8, characterized in that the conductive interconnections in the substrate are located on an elastic layer so that the conductive interconnections can bend to a certain extent and reversibly when the ensemble is mounted on the substrate.

10. A method as claimed in claim 8, characterized in that the second metal interconnection comprises a solder having a reflow temperature that is lower then the reflow temperature of the first metal interconnection.

11. A use of the device as claimed in claim 5, in which the heat sinks are fastened by electroconductive adhesive, during the use of which the—first—heat sink is put to a different voltage than the second heat sink.

* * * * *